(12) United States Patent
Kim et al.

(10) Patent No.: US 11,295,824 B2
(45) Date of Patent: Apr. 5, 2022

(54) MEMORY CONTROLLER AND STORAGE DEVICE INCLUDING THE SAME

(71) Applicant: FADU Inc., Seoul (KR)

(72) Inventors: Hongseok Kim, Seoul (KR); Ilyong Jung, Seoul (KR); Youngnam Kim, Seongnam-si (KR); EHyun Nam, Seoul (KR)

(73) Assignee: FADU Inc., Seoul (KR)

( * ) Notice: Subject to any disclaimer, the term of this patent is extended or adjusted under 35 U.S.C. 154(b) by 0 days.

(21) Appl. No.: 17/132,098

(22) Filed: Dec. 23, 2020

(65) Prior Publication Data

US 2022/0005535 A1 Jan. 6, 2022

Related U.S. Application Data

(60) Provisional application No. 63/046,750, filed on Jul. 1, 2020.

(30) Foreign Application Priority Data

Jul. 1, 2020 (KR) .................. 10-2020-0080801

(51) Int. Cl.
| | |
|---|---|
| *G11C 11/56* | (2006.01) |
| *G11C 16/34* | (2006.01) |
| *G11C 16/08* | (2006.01) |
| *G06F 12/02* | (2006.01) |
| *G11C 16/26* | (2006.01) |
| *G06F 13/16* | (2006.01) |
| *G11C 16/10* | (2006.01) |

(52) U.S. Cl.
CPC ...... *G11C 16/3459* (2013.01); *G06F 12/0246* (2013.01); *G06F 13/1668* (2013.01); *G11C 16/08* (2013.01); *G11C 16/10* (2013.01); *G11C 16/26* (2013.01); *G11C 16/3404* (2013.01)

(58) Field of Classification Search
CPC .................................................. G11C 16/3459
See application file for complete search history.

(56) References Cited

U.S. PATENT DOCUMENTS

| | | | | |
|---|---|---|---|---|
| 9,128,827 | B2 * | 9/2015 | Bisen | G06F 11/1072 |
| 9,798,656 | B2 * | 10/2017 | Lee | G06F 12/0246 |
| 2017/0003880 | A1 * | 1/2017 | Fisher | G06F 12/0246 |
| 2019/0088293 | A1 * | 3/2019 | Kim | G11C 16/08 |

FOREIGN PATENT DOCUMENTS

| | | |
|---|---|---|
| KR | 10-2009-0036357 A | 4/2009 |
| KR | 10-2016-0075174 A | 6/2016 |
| KR | 10-2019-0143310 A | 12/2019 |

OTHER PUBLICATIONS

Korean Notice of Allowance dated Aug. 31, 2020 in counterpart Korean Patent Application No. 10-2020-0080801 (2 pages in Korean).

* cited by examiner

*Primary Examiner* — Min Huang
(74) *Attorney, Agent, or Firm* — NSIP Law (57) ABSTRACT

A memory controller and a storage device including the same are provided. The memory controller groups pages in a memory block into page groups of different classes according to bit error rates, and allocates a page to be programmed according to a reliability requirement of a logical block address (LBA).

8 Claims, 6 Drawing Sheets

MEMORY CONTROLLER AND STORAGE DEVICE INCLUDING THE SAME

BACKGROUND

1. Field

The disclosure relates to a memory controller and a storage device including the same, and more particularly, to a memory controller for grouping the pages of a memory block into page groups of different classes according to a bit error rate and allocating a page to be programmed according to the reliability requirement of a logical block address (LBA), and a storage device including the same.

2. Description of Related Art

Semiconductor memories are categorized into volatile memory and non-volatile memory according to the storage mechanisms of information. Volatile memories include dynamic random access memory (DRAM) and static random access memory (SRAM). Although the volatile memory provides fast read and write speeds, the volatile memory loses stored information when it is powered off. In contrast, the non-volatile memory maintains its stored information even after it is powered off and thus is used as a storage medium for storing data persistently irrespective of power-on or power-off. Non-volatile memories include erasable programmable read only memory (EPROM), electrically erasable programmable read only memory (EEPROM), ferroelectric RAM (FRAM), phase change RAM (PRAM), magnetoresistive RAM (MRAM), and flash memory.

Particularly, the flash memory is widely used as an audio and video data storage medium for information devices such as a computer, a smartphone, a digital camera, a voice recorder, and a camcorder.

A non-volatile memory device includes a memory cell array in which memory cells are arranged at the intersections between a plurality of word-lines WL and a plurality of bit-lines. The memory cell array includes a plurality of memory blocks, each memory block including a plurality of memory cells. Memory cells are classified into a single level cell (SLC) type that stores only one bit and a multi-level cell (MLC) type that stores two or more bits, according to the number of bits stored per cell. The MLC type is further divided into a 2-bit MLC that stores 2 bits, a 3-bit MLC (triple level cell; TLC) that stores 3 bits, and a 4-bit MLC (quad level cell; QLC) that stores 4 bits. A memory cell is in an erased state or a programmed state according to the number of electrons injected into the cell, and the number of electrons injected during program operation is determined according to a data value to be stored. Bit errors occur to memory cells due to various error mechanisms. Among the error mechanisms, there are a retention error and a read disturb error. In the case of a retention error, electrons are gradually leaked out from a memory cell over time after the program operation is performed on the memory cell, thereby causing a state transition of the cell and thus changing a stored bit value. In the case of a read disturb error, voltage stress is applied to the other word-lines in the same memory block when a page within a word-line is read, and a small number of electrons are injected into some cells in the stressed word-lines. As the number of injected electrons is accumulated, a cell state transition occurs, changing the stored bit value.

Retention errors have a high probability of being accumulated in a logical block address (LBA) where a write operation is rarely performed, whereas read disturb errors have a high probability of being accumulated in an LBA where a read operation is frequently performed. In general, MLC-type memories have different bit error rates (BERs) for pages included in a word-line. Therefore, it is preferable to write an LBA with a high probability of accumulating bit errors to a page with a relatively low BER. However, since the conventional memory controller determines a page to be programmed without considering the data attribute of each LBA, a bit error possibility may not be controlled on an LBA basis.

Accordingly, there is a pressing need for a method of solving the problem of the conventional memory controller.

SUMMARY

The present disclosure has been made in an effort to solve the above-mentioned problems of the prior art and an aspect of the present disclosure is to provide a memory controller for grouping the pages of a memory block into page groups of different classes according to bit error rates (BERs), calculating a relative reliability requirement value for each LBA based on the read/write history of the LBA, and performing a program operation on a page of a specific class according to the reliability requirement value.

According to an embodiment of the disclosure, a memory controller for controlling a non-volatile memory in which each of a plurality of word-lines is connected to a plurality of memory cells to form at least one memory block, each memory cell storing N-bit data (N is a natural number equal to or larger than 2) and each word-line being allocated N pages, includes a page group information manager configured to store page group information generated by encoding $2^N$ memory cell states corresponding to a threshold voltage distribution in N bits and grouping a plurality of pages in the memory block into page groups according to numbers of transitions between adjacent memory cell states at which a bit value changes, a data attribute value generator configured to calculate a data attribute value for each logical block address (LBA) by counting and adjusting the number of writes and the number of reads for the LBA, a reliability requirement value calculator configured to calculate a reliability requirement value for the LBA based on the data attribute value of the LBA, upon receipt of a write request from a host, and a grader configured to determine program allocation priorities for the page groups based on the reliability requirement value.

The data attribute value generator may be configured to perform subtraction adjustment by calculating the data attribute value by periodically subtracting A (A is a natural number equal to or larger than 1) from at least one of the number of writes or the number of reads.

When the data attribute value is "0", the data attribute value generator may skip the subtraction adjustment.

The reliability requirement value calculator may calculate the reliability requirement value by Equation 1, $$Rr = \frac{a \times R}{b \times W} \quad (1)$$

where Rr represents the reliability requirement value, W is the counted and adjusted number of writes, R is the counted and adjusted number of reads, and a and b are constants.

The grader may change the program allocation priorities of the page groups according to a range to which the reliability requirement value belongs.

The memory controller may further include a grade queue storing information about the program allocation priorities of the page groups.

The memory controller may further include a page allocator configured to select a free page to program write data from among the free pages in each page group in order of a higher-priority page group to a lower-priority page group according to the program allocation priorities in response to the write request received from the host.

According to an embodiment of the disclosure, a storage device includes a non-volatile memory in which each of a plurality of word-lines is connected to a plurality of memory cells to form at least one memory block, each memory cell storing N-bit data (N is a natural number equal to or larger than 2) and each word-line being allocated N pages, and a memory controller configured to control the non-volatile memory device.

The features and advantages of the disclosure will become more apparent from the following description based on the attached drawings.

The terms or words used in the specification and claims should not be interpreted in a conventional and lexical sense. Rather, they should be interpreted as meanings and concepts consistent with the technical idea of the disclosure based on the principle that the inventor can appropriately define the concept of terms in order to explain his or her invention in the best way.

According to the present disclosure, a page to which data is to be programmed is selected from among pages classified into different classes according to BERs by reflecting the data attributes of each LBA based on the read/write history of the LBA. Therefore, the probability of bit error occurrence may be effectively reduced.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The objects, specific advantages, and novel features of the disclosure will become more apparent from the following detailed description and preferred embodiments, examples of which are illustrated in the accompanying drawings. The same reference numerals and signs denote the same or like components even when they are shown in different accompanying drawings from one another. The term as used in the disclosure, "$1^{st}$", "$2^{nd}$", "first" or 'second' may be used for the names of various components, not limiting the components. These expressions are used only to distinguish one component from another component. Lest it should obscure the subject matter of the disclosure, a detailed description of well-known technologies is avoided.

Preferred embodiments of the disclosure will be described below in detail with reference to the attached drawings.

Figure 1:
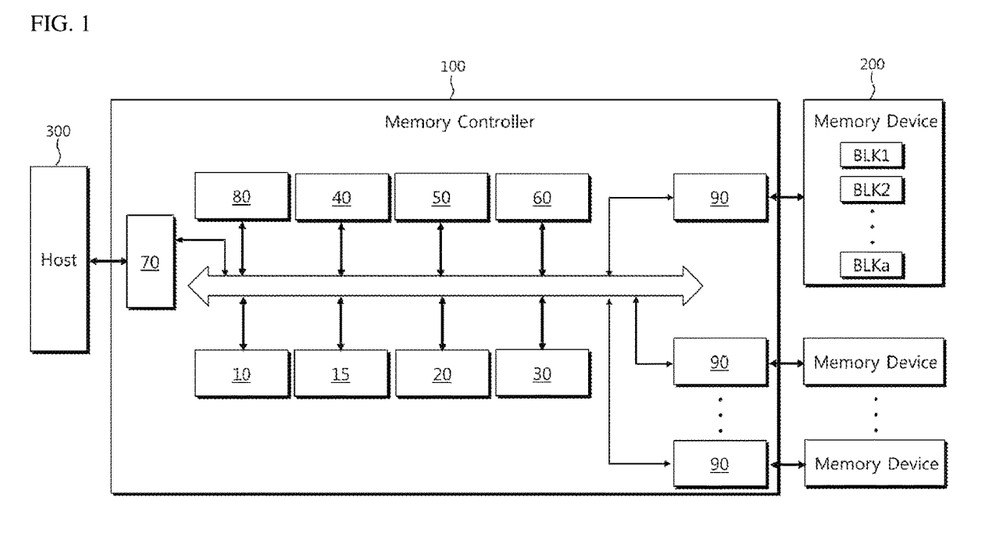
FIG. 1 is a block diagram illustrating a memory controller according to an embodiment of the disclosure.
Figure 2:
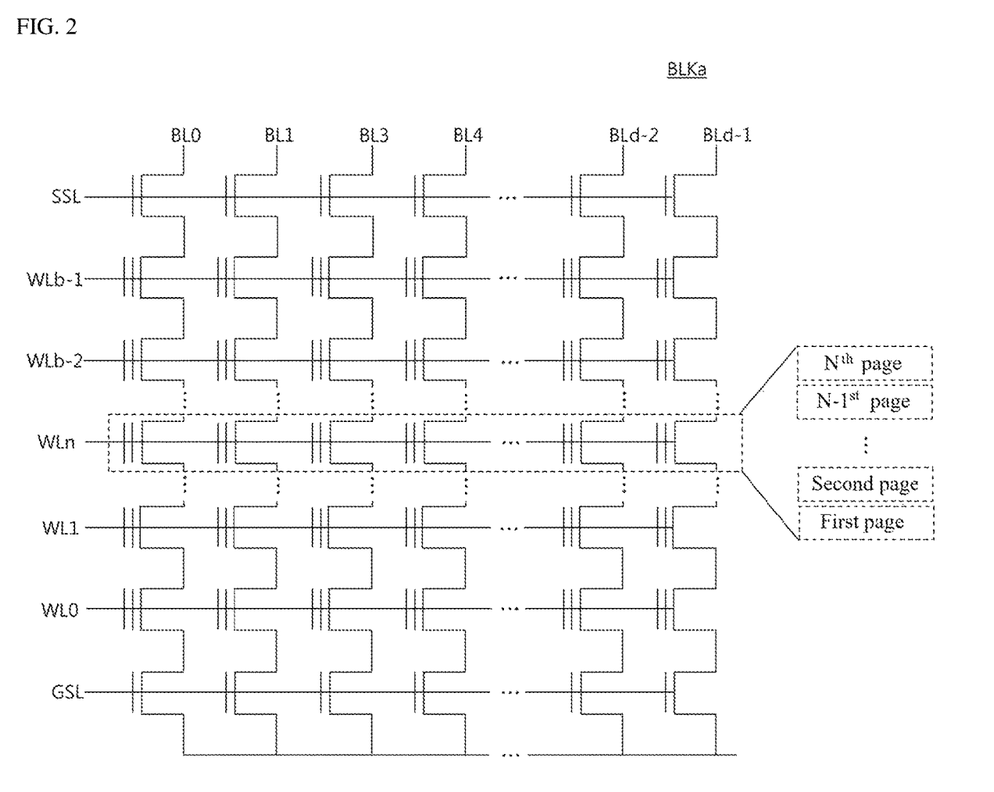
FIG. 2 is a diagram illustrating a memory block in a non-volatile memory device illustrated in FIG. 1.
Figure 3:
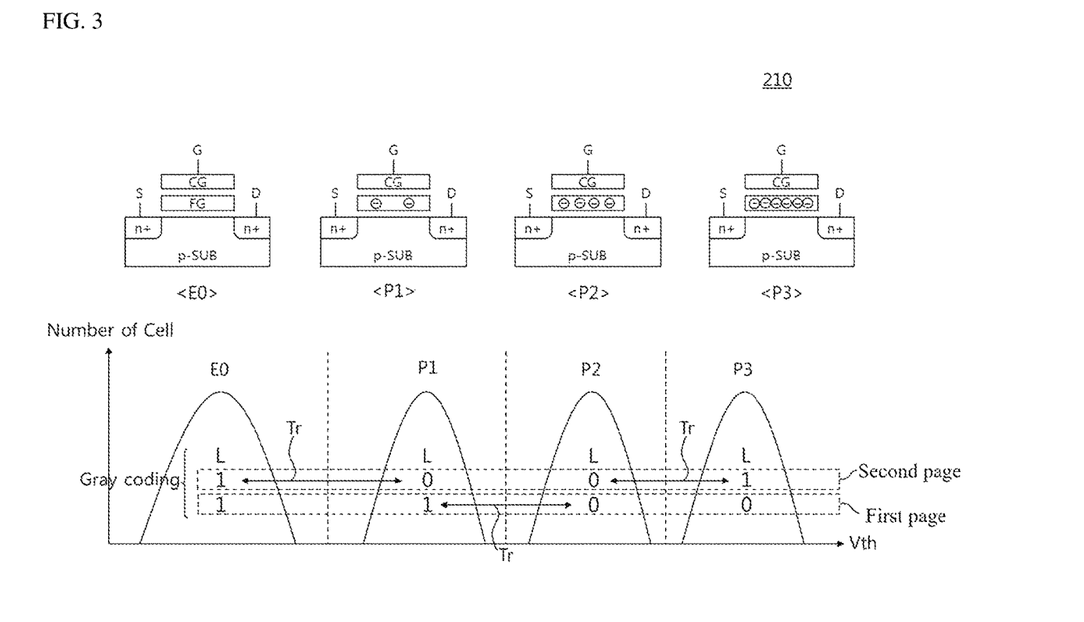
FIG. 3 is a diagram illustrating memory cells in the non-volatile memory device illustrated in FIG. 1 and a graph illustrating the threshold voltage distribution of memory cells.

FIG. 1 is a block diagram illustrating a memory controller according to an embodiment of the disclosure, FIG. 2 is a diagram illustrating a memory block in a non-volatile memory device illustrated in FIG. 1, and FIG. 3 is a diagram illustrating memory cells in the non-volatile memory device illustrated in FIG. 1 and a graph illustrating the threshold voltage distribution of memory cells.

Referring to FIGS. 1, 2 and 3, according to an embodiment of the disclosure, a memory controller 100 for controlling a non-volatile memory device 200 in which each of a plurality of word-lines WL is connected to a plurality of memory cells 210 to form at least one memory block BLKa, each memory cell 210 storing N-bit data (N is a natural number equal to or larger than 2) and each word-line WL being allocated N pages, includes a page group information manager 10 configured to store page group information generated by encoding $2^N$ memory cell states corresponding to a threshold voltage Vth distribution in N bits and grouping a plurality of pages in the memory block BLKa into page groups according to numbers of transitions between adjacent memory cell states at which a bit value changes, a data attribute value generator 20 configured to calculate a data attribute value for each logical block address (LBA) by counting and adjusting the number of writes and the number of reads for the LBA, a reliability requirement value calculator 30 configured to calculate a reliability requirement value for the LBA based on the data attribute value of the LBA, upon receipt of a write request from a host 300, and a grader 40 configured to determine program allocation priorities for the page groups based on the reliability requirement value.

The disclosure relates to the memory controller 100 that controls the non-volatile memory device 200. The memory controller 100 may control the non-volatile memory device 200 in response to a request from the host 300. For example, the memory controller 100 may control the non-volatile memory device 200 to read data from the non-volatile memory device 200 or program (write) data to the non-volatile memory device 200, in response to a data read/write request received from the host 300. The memory controller 100 may control program (write), read, and erase operations of the non-volatile memory device 200 by providing an address ADDR, a command CMD, and control signals to the non-volatile memory device 200. Further, data for the above operations may be transmitted and received between the memory controller 100 and the non-volatile memory device 200.

The host 300 may transmit a data read/write request and an address to the memory controller 100 and exchange data with the memory controller 100. For example, the host 300 may exchange data with the memory controller 100 based on at least one of various interface protocols such as a universal serial bus (USB) protocol, a multi-media card (MMC) protocol, a peripheral component interconnection (PCI) protocol, a PCI-express (PCI-E) protocol, an advanced technology attachment (ATA) protocol, a Serial-ATA protocol, a Parallel-ATA protocol, a small computer system interface (SCSI) protocol, an enhanced small disk interface (ESDI) protocol, an integrated drive electronics (IDE) protocol, a mobile industry processor interface (MIPI) protocol, and a universal flash storage (UFS) protocol. The host 300 may be any of portable electronic devices such as a mobile phone and a laptop computer, and electronic devices such as a desktop computer, a game console, and a television (TV).

Referring to FIG. 2, the non-volatile memory device 200 may include at least one memory cell array. The memory cell array may include a plurality of memory cells 210 arranged at the intersections between a plurality of word-lines WL0 to WLb−1 (b is a natural number equal to or larger than 2) and a plurality of bit lines BL0 to BLd−1 (d is a natural number equal to or larger than 2). Each memory cell 210 is a multi-level cell (MLC) storing 2 or more bits of data, for example, a 2-bit MLC storing 2-bit data, a triple level cell (TLC) storing 3-bit data, a quad-level cell (QLC) storing 4-bit data, or another type of MLC storing more bits of data. However, the disclosure is not limited thereto, and some of the memory cells 210 may be single level cells (SLCs) each storing 1-bit data, and the other memory cells 210 may be MLCs. The memory device 200 may be any of a NAND flash memory, a vertical NAND flash memory (VNAND), a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), and a combination thereof. The memory device 200 may perform operations such as program (write), read, and erase in response to signals received from the memory controller 100. The memory cell array may include at least one memory block BLKa (a is a natural number equal to or larger than 1), and each memory block BLKa may include a plurality of pages. The NAND flash memory device may perform an erase operation in units of a block BLKa, and perform program (write) and read operations in units of a page within each word-line WL. A page includes a plurality of memory cells 210 connected to one word-line WL. In the non-volatile memory device 200 including MLCs each storing N-bit data (N is a natural number equal to or larger than 2), N pages may be allocated to each word-line WL. For example, 2 pages are allocated per word-line WL in 2-bit MLCs, 3 pages are allocated per word-line WL in TLCs, and 4 pages may be allocated per word-line WL in QLC s.

Referring to FIG. 3, in a memory cell 210, a source S and a drain D may be formed on a substrate SUB, and a channel region may be formed between the source S and the drain D. A floating gate FG may be formed on the channel region, and an insulating layer such as a tunneling oxide may be disposed between the channel region and the floating gate FG. A control gate CG may be formed on the floating gate FG, and an insulating layer such as a blocking oxide may be disposed between the floating gate FG and the control gate CG. Voltages required for program, erase, and read operations for the memory cell 210 may be applied to the substrate SUB, the source S, the drain D, and the control gate CG.

The states of the memory cell 210 may be distinguished by threshold voltages Vth, and the threshold voltages Vth may be determined according to numbers of electrons stored in the floating gate FG. As more electrons are stored in the floating gate FG, the threshold voltage Vth of the memory cell 210 is higher. The memory cell 210 storing N-bit data (N is a natural number equal to or larger than 2) has $2^N$ states corresponding to a threshold voltage distribution. For example, a 2-bit MLC has one of an erase state E0 in which no electrons are stored, and a first programmed state P1, a second programmed state P2, and a third programmed state P3 which are determined according to the number of injected electrons. The threshold voltage Vth is different in each state, and increases from the erase state E0 with no stored electrons to the third programmed state P3 with the largest number of electrons.

Specifically, the memory controller 100 according to the disclosure may include the page group information manager 10, the data attribute value generator 20, the reliability requirement value calculator 30, and the grader 40.

The page group information manager 10 stores page group information generated by grouping a plurality of pages in a memory block BLKa into page groups. The page group information is information obtained by encoding $2^N$ states of each memory cell 210 in N bits (N is a natural number equal to or larger than 2) and grouping the pages within the memory block BLKa into page groups according to numbers of transitions causing bit errors.

For example, $2^N$ memory cell states may be encoded in N bits (N is a natural number equal to or larger than 2) by gray coding. A gray code is designed to change only one bit between adjacent codes when one gray code number changes to the next gray code number. A state of the memory cell 210 may be represented by gray coding so that only one bit in the memory cell 210 is changed when a memory cell state transition occurs.

Different bits within a memory cell 210 are assigned to different pages within a word-line WL. All pages in a memory block BLKa may be grouped according to the number of transitions between adjacent cell states in which the assigned bit within the memory cell changes. That is, pages with the same number of transitions may be grouped into the same page group.

Referring to FIG. 3, in the case of a 2-bit MLC, if a first bit value and a second bit value are assigned using gray coding, the erase state E0 may be encoded to a state [11] by assigning "1" as each of the first bit value and the second bit value. The first programmed state P1 may be encoded to a state [01] by assigning "1" as the first bit value and "0" as the second bit value. The second programmed state P2 may be encoded to a state [00] by assigning "0" as each of the first bit value and the second bit value. The third programmed state P3 may be encoded to a state [10] by assigning "0" as the first bit value and "1" as the second bit value. The first bit values of the states E0 and P1 to P3 may be assigned to the first page within a word-line WL, and the second bit values of the states E0 and P1 to P3 may be assigned to the second page within the same word-line WL. The number of transitions Tr in which the first bit value changes is one and the transition Tr occurs between P1 and P2. The number of transitions in which the second bit value changes is two and the transitions Tr occur between E0 and P1 and between P2 and P3, respectively. Therefore, the first page and the second page are distinguished from each other according to the number of transition Tr. The first pages allocated to each word-line WL in the memory block BLKa may be grouped into a first group, and the second pages allocated to each word-line WL in the memory block BLKa may be grouped into a second group.

The number of transitions may indicate a bit error probability. Given almost the same transition probability, it may be said that the bit error probability is higher in a page group with a larger number of transitions.

A bit error occurs in a memory cell 210 due to various causes, typically including a retention error and a read disturb error. In the case of a retention error, electrons are gradually leaked out from the memory cell 210 over time after the program operation is performed on the memory cell 210, thereby causing a state transition of the memory cell 210 and thus changing a stored bit value. In the case of a read disturb error, voltage stress is applied to the other word-lines WL in the same memory block BLKa while reading a page within a word-line, and a small number of electrons are injected into some memory cells 210 in the stressed word-lines WL. As the number of injected electrons is accumulated, a memory cell state transition occurs and thus a stored bit value is changed.

Figure 4:
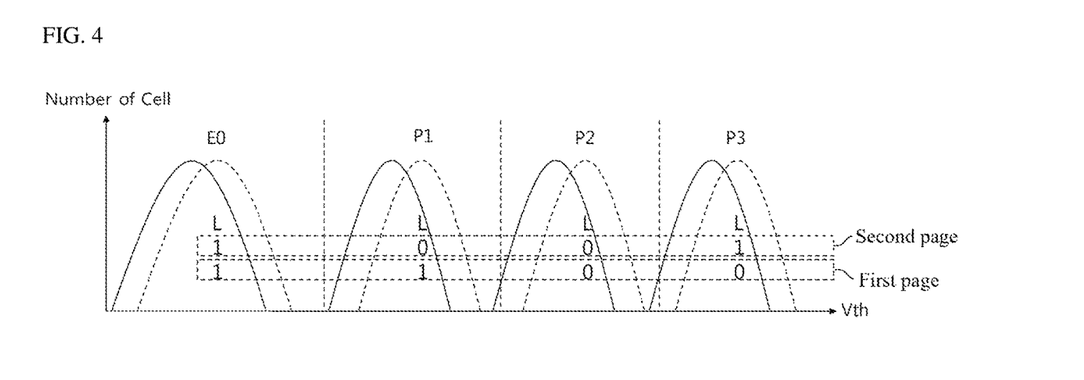
FIG. 4 is a graph illustrating a threshold voltage distribution of memory cells, referred to for describing a retention error.

FIG. 4 illustrates a graph of a threshold voltage distribution of a memory cell 210, referred to for describing a retention error. Referring to FIG. 4, when electrons are leaked from the memory cell 210 due to retention error, the threshold voltage is lowered after the leak (indicated by a solid line) than before the leak (indicated by a dotted line). In FIG. 4, there are three possible transitions, P1-to-E0, P2-to-P1, and P3-to-P2 transitions. In the first page within a word-line WL, bit flipping from "0" to "1" occurs only in the P2-to-P1 transition, with no bit error in the other transitions. In contrast, bit errors occur in the remaining two transitions except for the P2-to-P1 transition in the second page within a word-line WL. Since the second page has more transitions in which bit errors occur, it may be said that the second page is more susceptible to retention errors.

Figure 5:
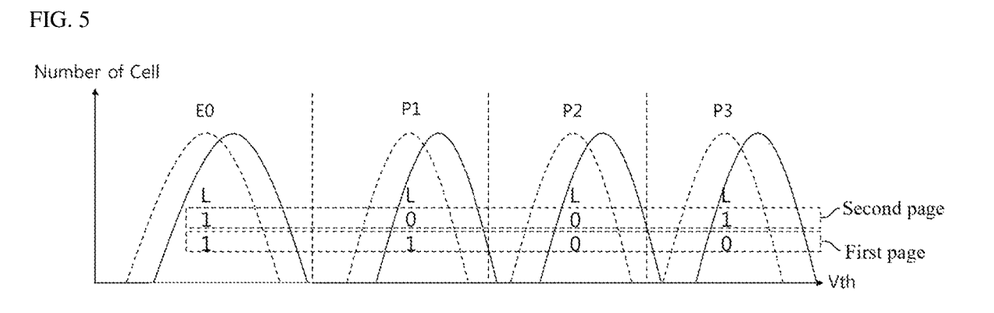
FIG. 5 is a graph illustrating a threshold voltage distribution of memory cells, referred to for describing a read disturb error.

FIG. 5 illustrates a graph of a threshold voltage distribution of a memory cell 210, referred to for describing a read disturb error. Referring to FIG. 5, in the case of a read disturb error, since electrons are injected into the memory cell 210, the threshold voltage is higher after the injection (indicated by a solid line) than before the injection (indicated by a dotted line). In the P1-to-P2 transition, a bit error occurs in the first page within a word-line WL, with no bit error in the second page within a word-line WL. In contrast, in the E0-to-P1 and P2-to-P3 transitions, bit errors occur in the second page, with no bit error in the first page. Like a retention error, since the second page has more transitions prone to bit errors, it may be said that the second page is more susceptible to read disturb errors.

The above examples may be generalized to the feature that at least two of N different pages (N is a natural number equal to or larger than 2) in the same word-line WL have different bit error rates (BERs) and the BER is higher in a page including more cell state transitions in which bit errors occur. For example, in the non-volatile memory device 200 including 2-bit MLCs as illustrated in FIGS. 3, 4 and 5, the second page has a high BER relative to that of the first page. Accordingly, the pages of the memory block BLKa are grouped into page groups of different classes according to the BERs of the pages, and the page group information is obtained by the grouping process.

Figure 6:
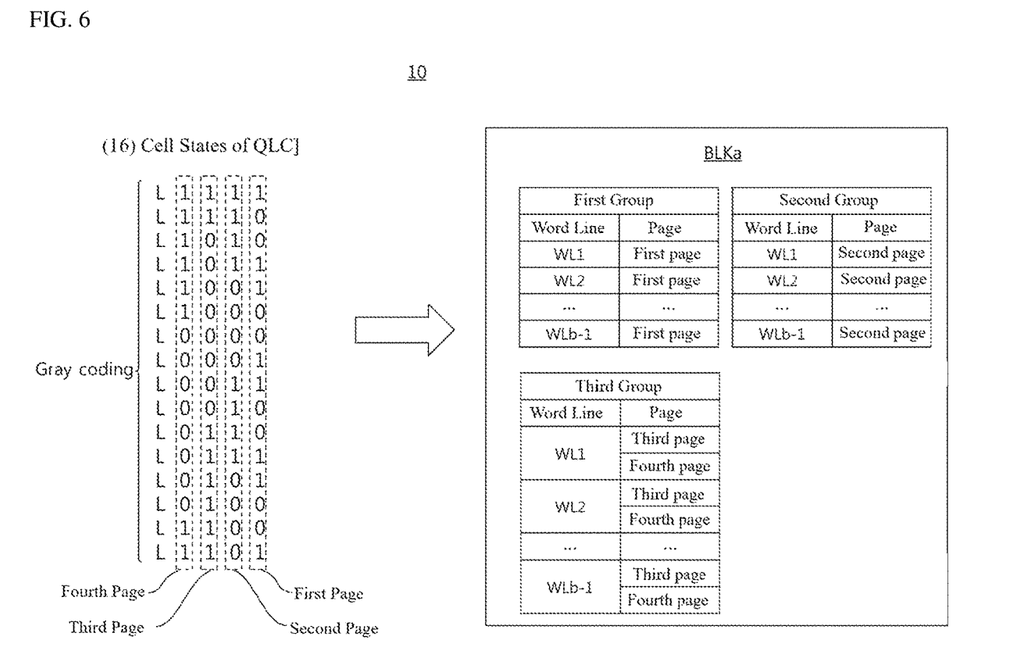
FIG. 6 is a diagram illustrating an operation of a page group information manager illustrated in FIG. 1.

While a 2-bit MLC has been taken for example in the above description, the disclosure is not limited to the 2-bit MLC. FIG. 6 is a diagram describing an operation of the page group information manager illustrated in FIG. 1. In FIG. 6, a QLC has $2^4$ (=16) states. These states are encoded by gray coding and each bit constituting one gray code value are assigned to each of first to fourth pages. The first page has 8 cell state transitions in which bit errors occur, the second page has 3 transitions, and each of the third and fourth pages has 2 transitions. Accordingly, the first pages allocated to each of the plurality of word-lines WL may be grouped into a first group, the second pages may be grouped into a second group, and the third and fourth pages may be grouped into a third group. The BER decreases from the first group including the first pages with the largest number of transitions to the third group including the third and fourth pages with the smallest number of transitions.

This page group information is stored in the page group information manager 10, and a page group information generator 15 may be separately provided to generate the page group information. However, the page group information generator 15 is not a compulsory component, and the page group information manager 10 may generate the page group information.

The data attribute value generator 20 calculates a data attribute value for each LBA. Data attribute values may be generated by counting and adjusting the number of writes and the number of reads for each of a plurality of LBAs. Among data read/write requests from the host 300, a write request may include an LBA, an opcode (operation code) indicating write operation, and data, and a read request may include an LBA and an opcode indicating read operation. Accordingly, when the memory controller 100 processes the write request and the read request of the host 300, the memory controller 100 may count the number of writes and the number of reads corresponding to respective requests for each LBA as listed in Table 1 below.

TABLE 1

| LBA | Number of writes | Number of reads |
|-----|------------------|-----------------|
| 0   | 94               | 15              |
| 1   | 10               | 3508            |
| 2   | 1                | 2               |
| ... | ...              |                 |
| M-1 | 55               | 0               |

In Table 1, when a new write (read) request is received and processed for each LBA, the number of writes (reads) for the LBA is increased by one. The counted numbers of writes and reads may be adjusted to obtain data attribute values. That is, the data attribute values may be calculated by periodically subtracting A (A is a natural number equal to or larger than 1) from at least one of the number of writes or the number of reads. The data attributes of an LBA may change dynamically, and the most recent data attributes are important. Therefore, count increments caused by data read/write requests made in a relatively distant past are removed by A. The subtracted values A may be equal or different for the number of writes and the number of reads. For example, "1" may periodically be subtracted only from the number of writes or from each of the number of writes and the number of reads, or "1" may periodically be subtracted from the number of writes and "2" from the number of reads.

The period of the subtraction adjustment may be arbitrarily set. For example, when the subtraction adjustment period is set to 30 days, A may be subtracted for each LBA every 30 days. The data attribute values are continuously calculated for each LBA, and when a data attribute value of a specific LBA is "0" during the calculation, the subtraction adjustment may be skipped for the LBA. For example, subtraction of 1 from the number of writes and the number of reads in Table 1 may result in data attribute values for each LBA, illustrated in Table 2 below.

TABLE 2

| LBA | Write data attribute value | Read data attribute value |
|-----|---------------------------|---------------------------|
| 0   | 93                        | 14                        |
| 1   | 9                         | 3507                      |
| 2   | 0                         | 1                         |
| ... |                           |                           |
| M-1 | 54                        | 0                         |

The data attribute values for each LBA indicate the data attributes of the LBA. A comparison between LBA 1 and LBA M−1 in Table 2 reveals that LBA 1 has a data attribute of few writes and a lot of reads and LBA M−1 has a data attribute of many writes and no reads. The probability of accumulating retention errors and read disturb errors may be determined based on the data attributes. An LBA with few writes has a high probability of accumulation of retention errors due to leakage of electrons over time in the memory cell 210, and an LBA with many reads has a high probability of accumulation of read disturb errors due to injection of electrons into the memory cell 210

The reliability requirement value calculator 30 calculates a reliability requirement value for a corresponding LBA based on a data attribute value in response to a write request from the host 300. As described above, an LBA with few writes or many reads requires high reliability because of its high BER. Accordingly, the reliability requirement value calculator 30 may calculate a reliability requirement value for the LBA for which write is requested, based on the data attribute values of the LBA. For example, when the memory controller 100 receives a first write request from the host 300, the reliability requirement value of LBA 1 is calculated based on the data attribute value of LBA 1 corresponding to the write request.

The reliability requirement value may be calculated according to Equation 1.

$$Rr = \frac{a \times R}{b \times W} \quad (1)$$

where Rr represents the reliability requirement value, W represents the counted and adjusted number of writes (a write data attribute value), R represents the counted and adjusted number of reads (a read data attribute value), and a and b are constants.

Equation 1 reflects the property that when reading is frequent, the probability of read disturb errors is high and thus the reliability requirement is high, whereas when writing is frequent, a retention period is short and thus the reliability requirement is lowered.

The grader 40 assigns program allocation priorities to the page groups based on reliability requirement values. As described before, since the page groups are defined according to their BER, the grader 40 may prioritize the page groups in terms of program assignment such that an LBA having a relatively high reliability requirement value is programmed to a page group having a relatively low BER, and an LBA having a relatively low reliability requirement value is programmed to a page group having a relatively high BER.

The program allocation priorities of the page groups may be changed according to a reliability requirement value range. For example, as shown in Table 3 below, reliability requirement values may be divided into 4 ranges, and different program allocation priorities may be determined for the page groups in each range. The page groups are represented as first to third groups (refer to FIG. 6) according to QLCs (the BER decreases from the first group to the third group).

TABLE 3

| Reliability requirement value | Program allocation priorities for page groups |
|-------------------------------|-----------------------------------------------|
| >2                            | $3^{rd}$ group –> $2^{nd}$ group –> $1^{st}$ group |
| 1~2                           | $2^{nd}$ group –> $3^{rd}$ group –> $1^{st}$ group |
| 0~1                           | $2^{nd}$ group –> $1^{st}$ group –> $3^{rd}$ group |
| ≤0                            | $1^{st}$ group –> $2^{nd}$ group –> $3^{rd}$ group |

The memory controller 100 according to the disclosure may further include a grade queue 50 to store program allocation priority information for the page groups. When the grader 40 determines program allocation priorities for the page groups, information about the program allocation priorities is stored in the grade queue 50.

The memory controller 100 according to the present disclosure may further include a page allocator 60. When the memory controller 100 receives a write request from the host 300, the page allocator 60 selects a page to which write data is to be programmed according to the program allocation priorities. Since write data may be programmed in a free page, the programming operation may be controlled by selecting a free page belonging to each page group in the order of a higher-priority page group to a lower-priority page group. For example, referring to Table 3, when the reliability requirement value exceeds 2, the page allocator 60 determines whether a free page exists among pages belonging to the third page group. In the presence of a free page, write data may be programmed to the free page. In the absence of any free page in the third page group, it may be determined whether a free page exists in the second page group. In the presence of a free page in the second group, the write data may be programmed to the free page. In the absence of any free page in the second group, the write data may be programmed to a free page of the first page group.

The above-described page group information manager 10, page group information generator 15, data attribute value generator 20, reliability requirement value calculator 30, grader 40, and page allocator 60 may be implemented in hardware or software, respectively. That is, the components may be implemented in the form of digital or analog circuits located inside the memory controller 100 or may be implemented as separate chips or modules and connected to the memory controller 100. Further, the components may be implemented by storing and executing software in an internal memory such as SRAM or an external memory such as floppy disk, compact disk, or USB flash drive. Further, the components may be implemented in a user-programmable form or may be integrated with another built-in module (e.g., a processor).

Further, the memory controller 100 according to the disclosure may further include a host interface 70 as a means for providing an interface with the host 300. The host interface 70 may be connected to the host 300 through at least one channel or port. For example, the host interface 70 may be connected to the host 300 through any one or all of a parallel AT attachment (PATA) bus, a serial AT attachment (SATA) bus, and a peripheral component interconnect express (PCIe) bus. Alternatively, the host interface 70 may be connected to the outside through a small computer system interface (SCSI) or a USB.

The memory controller 100 according to the disclosure may further include a memory channel controller 90 as a means for providing an interface with the non-volatile memory device 200. At least one non-volatile memory device 200 may be provided, and a plurality of memory channel controllers 90 may be used to support a plurality of non-volatile memory devices 200. One or more non-volatile memory devices 200 may be connected to one memory channel controller 90, and non-volatile memory devices 200 connected to one memory channel controller 90 may share the same data bus.

The memory controller 100 according to the disclosure may further include a processor 80 that controls the overall operation of the memory controller 100 to process a data read/write request from the host 300. The processor 80 may be implemented as a micro control unit (MCU), a central processing unit (CPU), or the like, and may drive software to control the operation of the memory controller 100.

Figure 7:
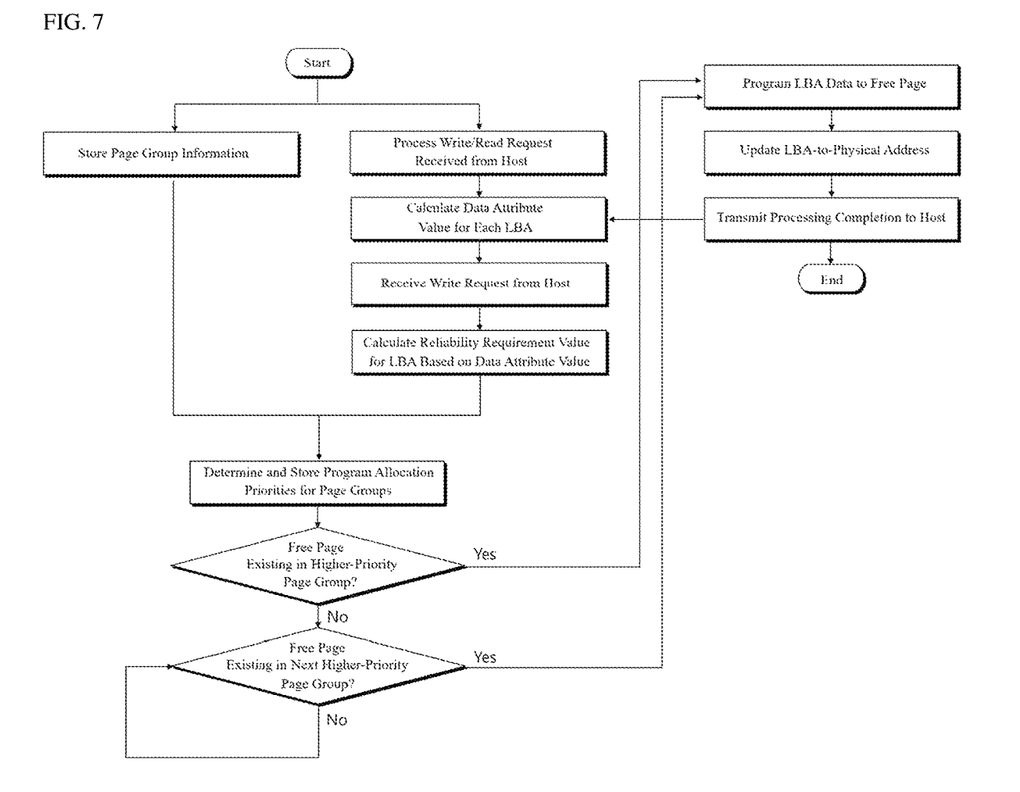
FIG. 7 is a flowchart illustrating a method of operating a memory controller according to an embodiment of the disclosure.

A detailed description will be given of a method of operating a memory controller according to the disclosure. FIG. 7 is a flowchart illustrating a method of operating a memory controller according to an embodiment of the disclosure.

The memory controller according to the disclosure stores page group information. The page group information is obtained by grouping pages in a block according to the number of adjacent memory cell state transitions at which bit values change. The memory cell stores N (N is a natural number equal to or larger than 2) bits of data and the state of the memory cell is encoded by gray coding. A word-line including a plurality of memory cells is composed of N pages and each bit within a memory cell is contained on a different page. One memory block includes a plurality of word-lines.

The memory controller receives K write requests (K is a natural number equal to or larger than 1) and L read requests (L is a natural number equal to or larger than 1) from the host, processes each of the requests. The memory controller calculates a data attribute value for each LBA in response to each write request and each read request. The data attribute value is obtained by periodically performing subtraction adjustment on the number of writes and/or the number of reads.

When receiving a $(K+1)^{th}$ write request from the host, the reliability requirement value of an LBA corresponding to the write request is calculated based on the data attribute value of the LBA. The reliability requirement value may be calculated by the foregoing Equation 1.

Once the reliability requirement value of the LBA is calculated, the page groups are prioritized in terms of program allocation according to the reliability requirement value and the program allocation priorities of the page groups are stored.

Subsequently, it is determined whether a free page exists in a higher-priority page group according to the program allocation priorities. In the absence of any free page in the higher-priority page group, it is determined whether a free page exists in the next-priority page group. In the absence of any free page in the next-priority page group, it is determined whether a free page exists in the next lower-priority page group. In the presence of a free page in the higher-priority page group or the next-priority page group, LBA data is programmed to the free page, the corresponding LBA is mapped to a the physical address, and then a processing completion for the $(K+1)^{th}$ write request is transmitted to the host. For the processed write request, the write count is increased by 1 for the LBA and reflected in the data attribute value of the LBA.

The memory controller according to the disclosure may be applied to a storage device, which will be described below.

Figure 8:
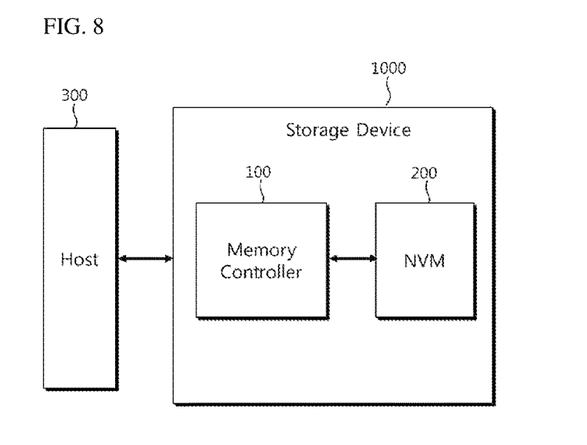
FIG. 8 is a block diagram illustrating a storage device according to an embodiment of the disclosure.
Figure 9:
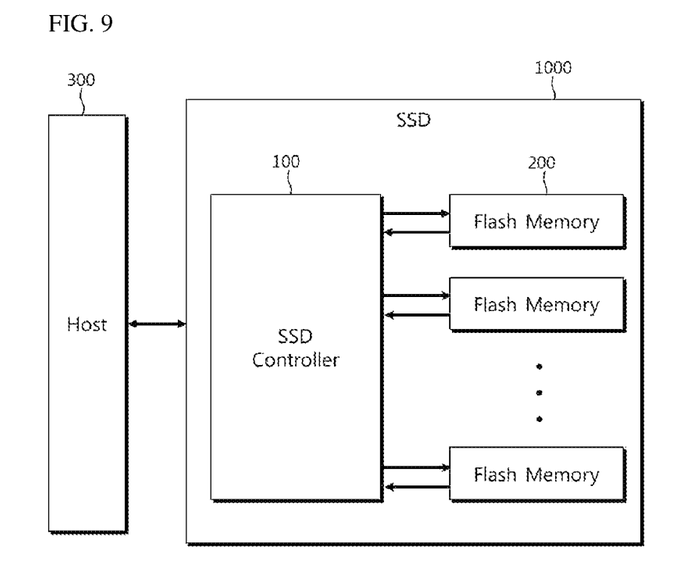
FIG. 9 is a block diagram illustrating a sold-state drive (SSD) to which the storage device according to the embodiment of the disclosure is applied.

FIG. 8 is a block diagram illustrating a storage device according to an embodiment of the disclosure, and FIG. 9 is a block diagram illustrating a solid state drive (SSD) to which a storage device according to an embodiment of the disclosure is applied.

As illustrated in FIG. 8, a storage device 1000 according to an embodiment of the disclosure may include a non-volatile memory device 200 in which each of a plurality of word-lines WL is connected to a plurality of memory cells to form at least one memory block, each memory cell storing N-bit data (N is a natural number equal to or larger than 2) and each word-line being allocated N pages, and the memory controller 100 for controlling the non-volatile memory device 200.

The storage device 1000 may include a memory card or a detachable mobile storage device. The storage device 1000 is used in connection to the host 300, and transmits and receives data to and from the host 300 via the host interface 70. The storage device 1000 may receive power from the host 300 and perform an internal operation.

The non-volatile memory device 200 may be a flash memory or the like. As described before, the memory controller 100 may group the pages of the memory block into page groups of different classes according to BERs, calculate a relative reliability requirement value for each LBA based on the history of the LBA, and control the non-volatile memory device 200 such that LBA data with a high reliability requirement value is programmed to a page with a relatively low BER possibility, and LBA data with a low reliability requirement value is programmed to a page with a relatively high BER, which has been described before and thus will not be described in detail herein.

Referring to FIG. 9, the storage device 1000 according to the disclosure may be an SSD.

Since the SSD is connected to the host 300, the host 300 may write data to the SSD or read data stored in the SSD. The SSD may exchange signals with the host 300 via the host interface and receive power through a power connector. The SSD 1000 may include a plurality of non-volatile memory devices 200 and an SSD controller. The non-volatile memory devices 200 may be implemented as PRAM, MRAM, ReRAM, FRAM, or the like as well as flash memory. The plurality of non-volatile memory devices 200 may be connected to the SSD controller through a plurality of channels. In this case, one or more non-volatile memory devices 200 may be connected to one channel, and non-volatile memory devices 200 connected to one channel may be connected to the same data bus.

The memory controller 100 according to the disclosure is provided as the SSD controller and transmits and receives signals to and from the host 300 via the host interface. Commands, addresses, data, and so on may be transmitted in signals, and data is written to or read from a non-volatile memory device 200 according to a command from the host 300.

While the disclosure has been described in detail with reference to specific embodiments, the embodiments are intended only for describing the disclosure, not limiting the disclosure. It is apparent to those skilled in the art that many variations or modifications can be made without departing the scope and spirit of the disclosure.

Simple modifications and changes of the disclosure fall within the scope of the disclosure and the specific protection scope of the disclosure will become apparent from the appended claims.

What is claimed is:

1. A memory controller for controlling a non-volatile memory in which each of a plurality of word-lines is connected to a plurality of memory cells to form at least one memory block, each memory cell storing N-bit data (N is a natural number equal to or larger than 2) and each word-line being allocated N pages, the memory controller comprising:
   a page group information manager configured to store page group information generated by encoding $2^N$ memory cell states corresponding to a threshold voltage distribution in N bits and grouping a plurality of pages in the memory block into page groups according to numbers of transitions between adjacent memory cell states at which a bit value changes;
   a data attribute value generator configured to calculate a data attribute value for each logical block address (LBA) by counting and adjusting the number of writes and the number of reads for the LBA;
   a reliability requirement value calculator configured to calculate a reliability requirement value for the LBA based on the data attribute value of the LBA, upon receipt of a write request from a host; and
   a grader configured to determine program allocation priorities for the page groups based on the reliability requirement value.

2. The memory controller according to claim 1, wherein the data attribute value generator is configured to perform subtraction adjustment by calculating the data attribute value by periodically subtracting A (A is a natural number equal to or larger than 1) from at least one of the number of writes or the number of reads.

3. The memory controller according to claim 2, wherein when the data attribute value is "0", the data attribute value generator skips the subtraction adjustment.

4. The memory controller according to claim 1, wherein the reliability requirement value calculator calculates the reliability requirement value by Equation 1, $$Rr = \frac{a \times R}{b \times W} \quad (1)$$

where Rr represents the reliability requirement value, W is the counted and adjusted number of writes, R is the counted and adjusted number of reads, and a and b are constants.

5. The memory controller according to claim 1, wherein the grader changes the program allocation priorities of the page groups according to a range to which the reliability requirement value belongs.

6. The memory controller according to claim 1, further comprising a grade queue storing information about the program allocation priorities of the page groups.

7. The memory controller according to claim 1, further comprising a page allocator configured to select a free page to program write data from among the free pages in each page group in order of a higher-priority page group to a lower-priority page group according to the program allocation priorities in response to the write request received from the host.

8. A storage device comprising:
   a non-volatile memory in which each of a plurality of word-lines is connected to a plurality of memory cells to form at least one memory block, each memory cell storing N-bit data (N is a natural number equal to or larger than 2) and each word-line being allocated N pages; and
   a memory controller configured to control the non-volatile memory device according to any of claim 1.

* * * * *